United States Patent
Kwan et al.

(10) Patent No.: US 10,129,121 B2
(45) Date of Patent: Nov. 13, 2018

(54) CLOCK CIRCUIT JITTER CALIBRATION

(71) Applicant: Oracle International Corporation, Redwood City, CA (US)

(72) Inventors: Philip Kwan, San Francisco, CA (US); Dawei Huang, San Diego, CA (US)

(73) Assignee: ORACLE INTERNATIONAL CORPORATION, Redwood City, CA (US)

( * ) Notice: Subject to any disclaimer, the term of this patent is extended or adjusted under 35 U.S.C. 154(b) by 0 days.

(21) Appl. No.: 15/450,217

(22) Filed: Mar. 6, 2017

(65) Prior Publication Data

US 2018/0254964 A1 Sep. 6, 2018

(51) Int. Cl.
| | |
|---|---|
| *H04B 17/21* | (2015.01) |
| *H04L 12/26* | (2006.01) |
| *H03L 7/08* | (2006.01) |
| *H03L 7/089* | (2006.01) |

(52) U.S. Cl.
CPC .......... *H04L 43/087* (2013.01); *H03L 7/0807* (2013.01); *H03L 7/0891* (2013.01); *H04B 17/21* (2015.01)

(58) Field of Classification Search
CPC ..... H04L 43/087; H04B 17/21; H03L 7/0807; H03L 7/0891
See application file for complete search history.

(56) References Cited

U.S. PATENT DOCUMENTS

| | | | |
|---|---|---|---|
| 9,036,764 B1* | 5/2015 | Hossain | H03L 7/087 375/355 |
| 2007/0224958 A1* | 9/2007 | Nedachi | H04L 1/24 455/226.1 |
| 2018/0205621 A1* | 7/2018 | Ungar | G06F 11/221 |

* cited by examiner

*Primary Examiner* — Vineeta S Panwalkar
(74) *Attorney, Agent, or Firm* — Marsh Fischmann & Breyfogle LLP; Kent A. Lembke; Daniel J. Sherwinter (57) ABSTRACT

Embodiments include systems and methods for calibrating clocking circuits for improved jitter performance. Embodiments operate in context of a clocking circuit coupled with a transceiver system that has a receiver that tracks a recovered clock phase according to a tracking code. For example, candidate configurations can be identified, each corresponding to a different respective combination of parameter values for programmable clocking circuit parameters. For each candidate configuration, embodiments can configure the clocking system accordingly, and can sample the tracking code over a sample window to measure a tracking code spread for the candidate configuration. The clocking circuit can be programmed according to which of the candidate configurations manifested a minimum tracking code spread, thereby effectively configuring the clocking circuit for minimum jitter generation and optimizing jitter performance of the transceiver.

17 Claims, 4 Drawing Sheets

CLOCK CIRCUIT JITTER CALIBRATION

FIELD

Embodiments relate generally to clocking circuits, and, more particularly, to techniques for calibrating clocking circuit parameters to improve overall jitter performance, such as in a phase-locked loop (PLL) circuit in a serializer/deserializer (SERDES).

BACKGROUND

Many integrated circuits have signal lanes that support transmission and/or receipt of data signals. Those signal lanes can include circuitry (e.g., serializer/deserializer, or SERDES, circuits) to prepare bit data for transmission and/or to recover bit data after receipt. Noise sources (e.g., power supplies) and other non-idealities can produce jitter (e.g., random jitter, or RJ) on clocking signals (e.g., on the output of the phase-locked loop (PLL)). For example, a PLL tends to be a highly sensitive circuit that is highly susceptible to internal and/or external noise, which can cause jitter. For high-speed SERDES links, jitter on the PLL output (e.g., primarily deterministic and random jitter) can appreciably affect the link performance, particularly where the PLL is the primary clock source for both the transmitter and receiver circuits of the SERDES. For example, jitter within a SERDES can degrade jitter generation on the transmitter side and can degrade jitter tolerance on the receiver side. The susceptibility of external noise and suppression of internal noise can be a function of PLL loop parameters (e.g., parameters of transmit and/or receiver filters, equalizers, etc.), and the performance can vary appreciably due to different process characteristics, voltages, temperatures, and/or other characteristics, even with the same loop parameter settings. Performance impacts can be further exacerbated when a single chip contains many lanes, each adding to process variations and ultimately degrading yield. For example, some modern processors include hundreds of lanes with tens of PLLs. Conventional approaches to addressing jitter performance in high-speed SERDES links tend to focus on designing high-accuracy PLLs across different corners, but such approaches can involve tremendous effort and can become impractical as the link speed and number of lanes increase.

BRIEF SUMMARY

Among other things, embodiments provide novel systems and methods for calibrating a clocking circuit for improved jitter performance. Embodiments operate in context of a clocking circuit coupled with a transceiver system that has a receiver that tracks a recovered clock phase according to a tracking code. For example, candidate configurations can be identified, each corresponding to a different respective combination of parameter values for programmable clocking circuit parameters. For each candidate configuration, embodiments can configure the clocking system accordingly, and can sample the tracking code over a sample window to measure a tracking code spread for the candidate configuration. The clocking circuit can be programmed according to which of the candidate configurations manifested a minimum tracking code spread, thereby effectively configuring the clocking circuit for minimum jitter generation and optimizing jitter performance of the transceiver.

BRIEF DESCRIPTION OF THE DRAWINGS

The present disclosure is described in conjunction with the appended figures.

In the appended figures, similar components and/or features may have the same reference label. Further, various components of the same type may be distinguished by following the reference label by a second label that distinguishes among the similar components. If only the first reference label is used in the specification, the description is applicable to any one of the similar components having the same first reference label irrespective of the second reference label.

DETAILED DESCRIPTION

Jitter (typically random jitter, or RJ) is typically inherent in serializer/deserializer (SERDES) circuits, particularly on clock outputs (e.g., phase-locked loop, or PLL, outputs). The jitter can appreciably affect the link performance, particularly where the PLL is the primary clock source for both the transmitter and receiver circuits of the SERDES. Process variation among different clocking circuits, such as across different PLL circuits on a processor, can generate different amounts of jitter (e.g., different jitter amplitude and/or frequency). For example, process variations can lead to different characteristics of loop parameters, such as transmit and/or receiver filters, equalizers, etc. Performance impacts can be further exacerbated when a single chip contains many lanes, each adding to process variations and ultimately degrading yield. For example, some modern processors include hundreds of lanes with tens of PLLs.

Conventionally, jitter performance of a PLL can be measured in a laboratory testing environment by probing the PLL output and measuring the jitter directly. However, such measurements may not accurately represent the jitter performance of the PLL in its operational context, such as in context of high-speed serial links. One reason is that much of the jitter comes from power supplies and/or other components coupled with the PLL in a particular application, and the jitter performance can vary due to operational variations in voltage, temperature, and/or other characteristics, even with the same loop parameter settings. In such an operational context, where the PLL is typically coupled with a transmitter system and/or receiver system, which are further coupled with a data channel, traditional approaches tend to be incapable of directly measuring jitter.

Embodiments described herein include novel techniques for indirectly measuring jitter in clocking circuits and/or configuring clocking circuit parameter settings for optimized jitter performance. As used herein, terms like "optimized" are not intended to be absolute; rather a metric is deemed optimized herein if a best result for that metric can be selected from a set of candidate results, even if there could possibly be an even further improvement to the metric. Some embodiments operate in context of a clocking circuit coupled with a transceiver system that has a receiver that tracks a recovered clock phase according to a tracking code (e.g., a PLL of a SERDES having a receiver with a clock data recovery (CDR) circuit).

Some embodiments can initially configure the clocking circuit according to a predefined default configuration (e.g., by setting a regulated supply voltage and/or a charge pump current of a PLL to nominal, or pre-calibrated, values) and can configure the transceiver system for internal loopback (e.g., by coupling a data output of a SERDES transmitter to a data input of the SERDES receiver). The clocking circuit can have a number of programmable clocking circuit parameters. A number of candidate configurations can be identified (e.g., stored in a state machine), each corresponding to a different respective combination of parameter values for the programmable clocking circuit parameters. In each of a number of iterations, embodiments can configure the clocking system according to a respective one of the candidate configurations (e.g., by setting a calibration code of the PLL) and can sample the tracking code (e.g., a locking code of a clock data recovery (CDR) circuit) over a sample window to measure a range of values of the tracking code as a tracking code spread associated with the candidate configuration.

The tracking code spread can be indicative of the amount of jitter in the recovered clocking signal, which can directly correspond to the amount of jitter generated by the clocking circuit. Embodiments can determine which of the candidate configurations manifested a minimum tracking code spread and can program the clocking circuit according to that configuration. The tracking code spread can be indicative of the amount of jitter in the recovered clocking signal, which can directly correspond to the amount of jitter generated by the clocking circuit; such that the candidate configuration manifesting the minimum code spread can correspond to the set of parameter values likely to manifest the smallest amount of jitter. Programming the clocking circuit for the smallest amount of jitter can effectively improve (e.g., optimize) the jitter performance of the transceiver.

In the following description, numerous specific details are set forth to provide a thorough understanding of the present invention. However, one having ordinary skill in the art should recognize that the invention may be practiced without these specific details. In some instances, circuits, structures, and techniques have not been shown in detail to avoid obscuring the present invention.

Figure 1:
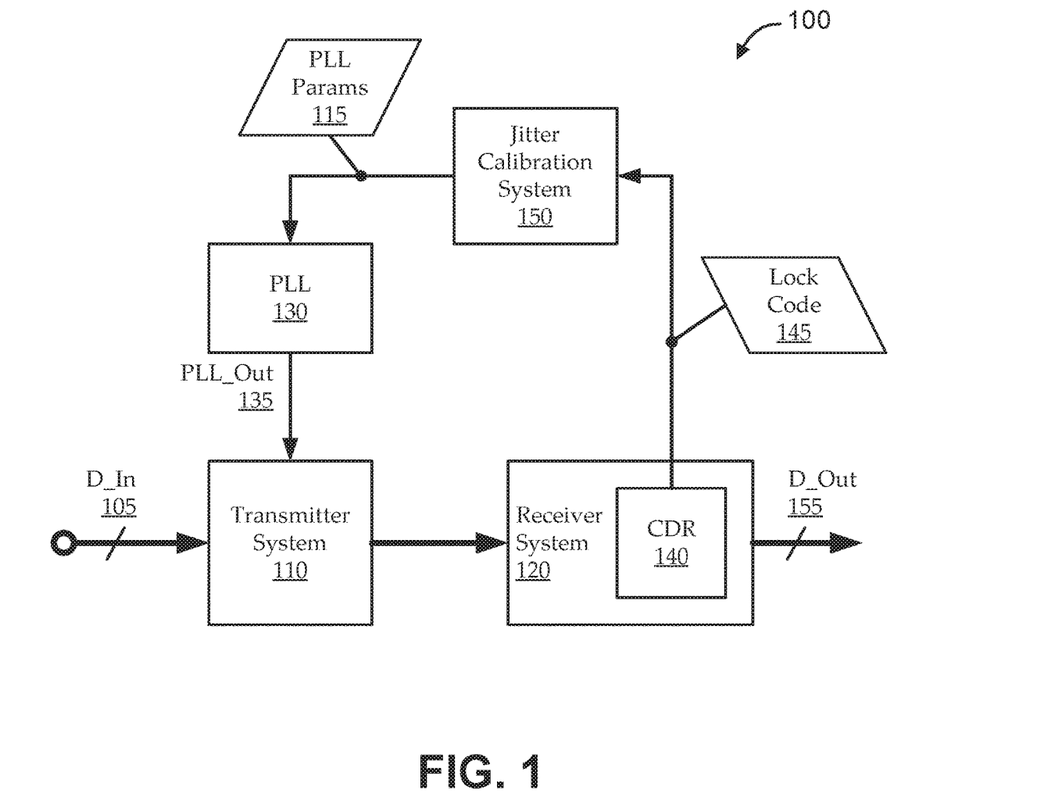
FIG. 1 shows a block diagram of an illustrative transceiver environment, as a context for various embodiments.

FIG. 1 shows a block diagram of an illustrative transceiver environment 100, as a context for various embodiments. The transceiver environment 100 can be implemented as, or can include, a serializer/deserializer (SERDES) system. For example, the transceiver environment 100 can be one of a number of SERDES systems integrated on a microprocessor and coupled with data lanes (e.g., transmit and receive channels. As illustrated, the transceiver environment 100 can include a jitter calibration system 150 coupled with a phase-locked loop (PLL) module 130. The PLL module 130 can be coupled with a transmitter system 110, which can be coupled with a receiver system 120. As described herein, in some implementations, the transmitter system 110 and the receiver system 120 can be configured for internal loopback. For example, the data signal output by the transmitter system 110 is routed back to the data input of the receiver system 120. While embodiments are described herein in relation to clocks generated with a PLL, techniques described herein can be implemented in any suitable clocking or other environment experiencing jitter (e.g., random jitter, or RJ). Further, functionality described with reference to particular blocks can be performed by any suitable block, and/or blocks can be separated or combined in alternative implementations.

In general, the PLL module 130 receives a reference clock signal (e.g., from a reference clock generator) and outputs a PLL output signal 135, which is a relatively stable clock signal at a particular frequency. Though the PLL module 130 uses feedback techniques to maintain a level of stability in the frequency and phase of the PLL output signal 135, the PLL output signal 135 can manifest jitter. For example, power supplies and/or other environmental factors can affect operation of components of the PLL module 130 in a manner that manifests as jitter on the PLL output signal 135. As the amount of jitter increases, the PLL output signal 135 can become less consistent, and performance of circuits relying on the PLL output signal 135, such as the transmitter system 110 and/or receiver system 120 can be negatively impacted.

For example, the receiver system 120 can include a clock data recovery (CDR) circuit 140 (or any other suitable tracking system) that seeks to recover data bits from a received signal by sampling the received signal according to a receiver-side clock. To reliably recover the data bits, the CDR circuit 140 can typically use feedback to maintain alignment between the phase of the receiver-side clock and the phase of the received signal. This can ensure that the received data signal is sampled closer to the center of the data eye, which can increase the bit detection margin for the CDR circuit 140. Jitter on the PLL output signal 135 can manifest as jitter on the data signal transmitted by the transmitter system 110 and received by the receiver system 120. Such jitter can cause a fluctuation in the phase of the received data signal. In the presence of such phase fluctuation, the CDR circuit 140 can dynamically adjust the phase of the receiver-side clock in a manner that substantially tracks the jitter.

The CDR circuit 140 can control the phase of the receiver-side clock using a tracking code, such as a CDR lock code 145. For example, if the phase of the received signal drifts, feedback in the CDR circuit 140 can detect the drift and can seek to lock onto the new phase by adjusting the CDR lock code 145, thereby adjusting the phase of the receiver-side clock to track the phase of the received signal. Accordingly, changes in the phase of the received signal over time can manifest as changes in the CDR lock code 145 over time; and larger swings in the phase of the received signal can manifest as larger swings in the CDR lock code 145.

The amount of jitter generated by the PLL module 130 can largely result from interactions between environmental non-idealities (e.g., power supply noise, etc.) and components of the PLL module 130. Accordingly, values of various PLL parameters 115 (values of electrical parameters of PLL components, such as voltages, currents, capacitance, resistance, etc.) can affect the amount and type of resulting jitter. For example, adjusting charge pump current and/or voltage-controlled oscillator (VCO) gain can increase or reduce the amount of jitter on the PLL output signal 135.

Embodiments include a jitter calibration system 150 that can adjust the configuration of the PLL module 130 by adjusting values of the PLL parameters 115, and can indirectly compute a jitter measurement for the particular configuration as a function of CDR lock code 145 measurement taken while the PLL module 130 operates in that configuration. For example, the jitter calibration system 150 can have, stored thereon, a number of candidate configurations, each corresponding to a combination of PLL parameter 115 settings. The jitter calibration system 150 can iterate through each candidate configuration computing a respective jitter measurement for each configuration. Embodiments can identify one of the candidate configurations as manifesting the smallest jitter measurement. In some implementations, the PLL parameters 115 can be set in accordance with the identified configuration, thereby calibrating the PLL module 130 to generate minimum jitter.

Figure 2:
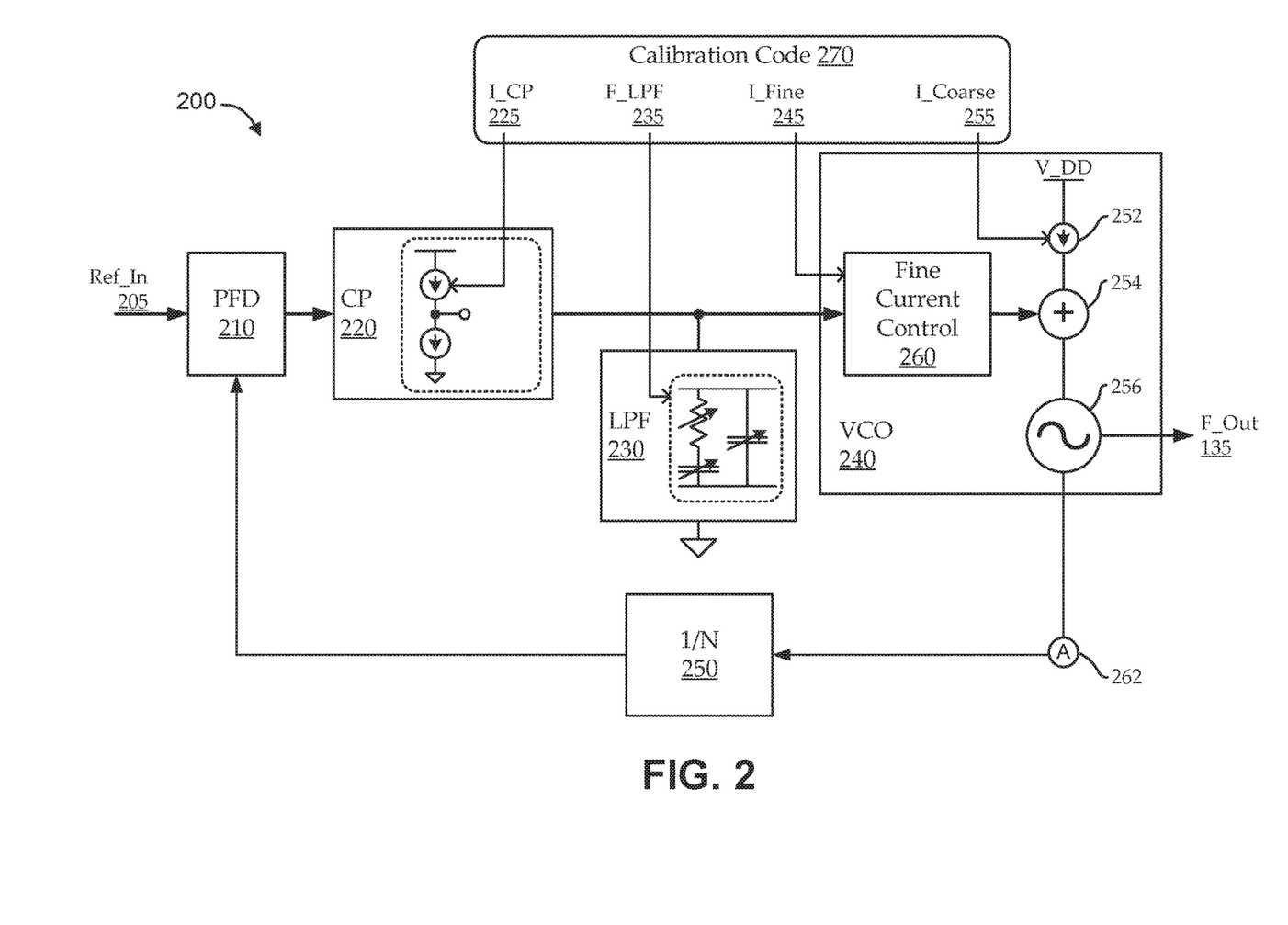
FIG. 2 shows an illustrative clocking system, according to various embodiments.

FIG. 2 shows an illustrative clocking system 200, according to various embodiments. The clocking system 200 can be an implementation of the PLL module 130 of FIG. 1. The illustrated clocking system 200 includes a phase frequency detector (PFD) 210, a charge pump 220, a low-pass filter 230, a ring voltage-controlled oscillator (VCO) 240, and a frequency divider 250. Illustrative circuits are shown for some of the components for the sake of added clarity, but those circuits are intended only to provide one possible implementation of such components. In general, the PLL module 130 generates a PLL output signal 135 from a reference clock signal 205, and stabilizes the PLL output signal 135 using a feedback loop. The PFD 210 receives the reference clock signal 205 and a feedback clock signal (generated from the PLL output signal 135 by the frequency divider 250) and compares the phases of the received signals. The output of the PFD 210 is passed to the charge pump 220, low-pass filter 230, and ring VCO 240, which amplify, filter, modulate, and/or otherwise convert the output of the PFD 210 into the PLL output signal 135 having a desired frequency and gain. The PLL output signal 135 can be fed back to the frequency divider 250, which can down-convert the PLL output signal 135 to a frequency appropriate for feedback to the input of the PFD 210.

Before the clocking system 200 is integrated into an operating environment (e.g., coupled with a transceiver, etc.), laboratory testing equipment can be used to directly measure jitter on the PLL output signal 135. For example, a probe can read the PLL output signal 135 at the point labeled "A", and can directly measure the amount of fluctuation on the phase of the PLL output signal 135 caused by jitter. Various PLL parameters 115 can be calibrated in such a setting. For example, embodiments include a calibration code 270, and the value of the calibration code 270 can hardware-program settings for the PLL parameters 115, such as charge pump current (I_CP) 225, LPF corner frequency (F_LPF) 235 (e.g., by setting variable resistance and/or capacitance of the filter components), and VCO gain (e.g., by setting a fine VCO current (I_Fine) 245 and/or a coarse VCO current (I_Coarse) 255. Some embodiments of the VCO 240 receive a supply voltage that is controlled by a combination of coarse and fine current levels. As illustrated, the oscillator 256 of the VCO 240 can be coupled with a regulated supply voltage (V_DD) via a summer 254, which sums a first current controlled by a fine current control module 260 (programmed according to I_Fine 245) and a second current controlled by a current source 252 (programmed according to I_Coarse 255).

As described herein, when the clocking system 200 is deployed in its operating environment, the amount of jitter generated by the clocking system 200 can depend, at least in part, on the settings of the PLL parameters 115 via the calibration code 270. However, once in its operating environment, there is typically no practical way to directly measure the jitter (e.g., to probe location "A"). Accordingly, conventional approaches tend to set the calibration code 260 according to calibration procedures and/or simulations prior to integrating the clocking system 200 in its operating environment, and those settings typically are not adjusted after that time. As described with reference to FIG. 1, embodiments herein provide novel approaches to indirectly measuring the generated jitter using a jitter calibration system.

Figure 3:
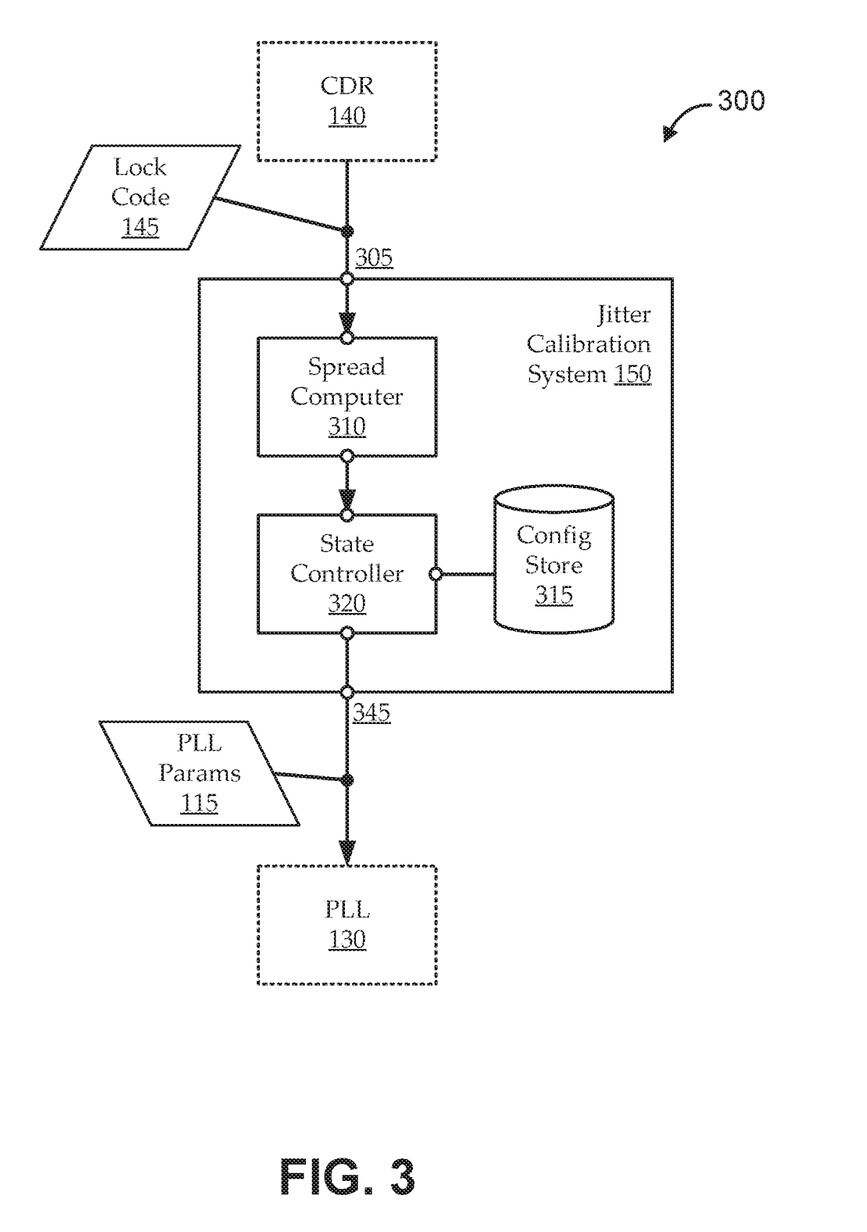
FIG. 3 shows an illustrative jitter measurement environment, according to various embodiments.

FIG. 3 shows an illustrative jitter measurement environment 300, according to various embodiments. The jitter measurement environment 300 includes an implementation of a jitter calibration system 150 and shows the CDR circuit 140 and the PLL module 130 for context. In some embodiments, the jitter calibration system 150 is implemented as a state machine having a lock code input 305 and a PLL parameter output 345. The jitter calibration system 150 can be coupled with an operating transceiver that has a transmitter and a receiver, the receiver having a clock tracking circuit that uses a tracking code to track a receiver data clock in the receiver to a transmitter data clock in the transmitter that corresponds to a clock signal output of the clocking circuit. For example, the clocking circuit can be a PLL, and the clock tracking circuit can be the CDR circuit 140 that uses the lock code 145 as its tracking code. In operation, the jitter calibration system 150 can receive the lock code 145 via the lock code input 305 and can output settings for PLL parameters 115 (e.g., as a calibration code) as a function of the received lock code input 305 and various settings and computations of the jitter calibration system 150. For example, as described herein, the jitter calibration system 150 can iteratively change the settings of the PLL parameters 115, each time measuring a spread of the lock code 145, to identify settings for the PLL parameters 115 that minimize (or otherwise reduce) the amount of jitter generated by the clocking circuit (e.g., the PLL module 130).

Embodiments of the jitter calibration system 150 can include a spread computer 310, a configuration data store 315, and a state controller 320. The spread computer 310 can be coupled with the lock code input 305 to receive the lock code 145 from the CDR circuit 140 over a time window. For example, the PLL module 130 is configured according to the present settings for the PLL parameters 115, which may be default settings (e.g., in a first iteration) or a candidate configuration being tested. As an example, the PLL parameters 115 can be set to configure the PLL module 130 with a predetermined regulated supply voltage level (e.g., by setting fine and/or coarse current control levels, or in any other suitable manner), with a predetermined nominal or calibrated charge pump current, etc. In that configuration, the PLL module 130 generates a certain amount of jitter as part of generating its output clock signal. As described above, the generated jitter manifests as jitter on the data output of the transmitter system of the transceiver and is received on the data input of the receiver system of the transceiver. The CDR circuit 140 of the receiver system can dynamically adjust its lock code 145 over time as tracks the received data signal. The amount of jitter on the received data signal can be reflected in the amount of dynamic adjustment of the lock code 145 needed by the CDR circuit 140 to maintain tracking (e.g., more jitter can manifest as a larger amount of spread of the lock code 145). Some embodiments described herein include (or assume) that the transceiver is configured for internal loopback (e.g., by coupling a data output of the transmitter with a data input of the receiver), such that the tracking of the CDR circuit 140 is indicative of the jitter generated by the PLL module 130 (i.e., otherwise, the CDR circuit 140 would be tracking data signals received from other transmitter systems unaffected by the jitter generated by the PLL module 130 of interest).

Embodiments of the spread computer 310 can output a lock code spread computed as a function of samples of the lock code input 305 obtained over a sampling window (e.g., a few hundred samples). In some implementations, the lock code spread is computed as the spread between the largest and smallest sampled values of the lock code input 305 over the sampling window. In other implementations, techniques are used to avoid using unreliable data samples. For example, in some implementations, the lock code 145 samples can substantially follow a statistical distribution, and the lock code spread can be computed as a predetermined range of the distribution (e.g., mean±one standard deviation, σ).

Embodiments of the state controller 320 can have an input coupled with the output of the spread computer 310 and an input coupled with the configuration data store 315. The state controller 320 can also include an output coupled with the PLL parameter output 345, the output comprising an indication of settings for some or all hardware-programmable PLL parameters 115 (e.g., some or all of a calibration code received as a configuration input to the PLL module 130). The output of the state controller 320 can correspond, for each of a number of configuration states, to a respective one of a number of candidate configurations stored by the configuration data store 315. In some implementations, the configuration data store 315 can be pre-loaded with a number of candidate values for each of one or more PLL parameters 115. In other implementations, some or all of the candidate configurations can be generated by the state controller 320 (e.g., based on limited stored information). For example, the configuration data store 315 can store a minimum and maximum setting for a particular PLL parameter 115, and the state controller 320 can generate the candidate configurations by interpolating a predetermined number of settings between the minimum and maximum values. In one implementation, the candidate configurations correspond to a range of values for one particular programmable clocking circuit parameters (e.g., with the other parameters held constant). In another implementation, each candidate configuration corresponds to a unique combination of settings for two or more programmable clocking circuit parameters. For example, each of the plurality of candidate configurations corresponds to a respective one of N×M combinations of M parameter values for each of N of programmable clocking circuit parameters. In one implementation, each candidate configuration corresponds to one of 5 settings for charge pump current, and one of 5 settings for VCO supply voltage (e.g., coarse current level), such that 25 candidate configurations correspond to all the combinations of those settings. In various implementations, candidate configurations can include fewer than all the possible combinations of settings, additional configurations (e.g., a default, or baseline, configuration), etc.

For each configuration state, the output of the state controller 320 can correspond with a respective candidate configuration of the PLL parameters 115. This can effectively configure the PLL module 130 to operate according to the candidate configuration until the state controller 320 changes to a different configuration state. As described above, while operating in that candidate configuration, the PLL module 130 can generate an amount of jitter, which can be reflected in the lock code spread computed by the spread computer 310. In each configuration state, embodiments of the state controller 320 can record the computed lock code spread in association with the candidate configuration for that configuration state. When the state controller 320 has iterated through some or all configuration states (e.g., stored in the configuration data store 315) and has recorded associated lock code spreads, embodiments of the state controller 320 can identify a smallest of the recorded lock code spreads. As described herein, the smallest lock code spread can correspond with the configuration of PLL parameters 115 resulting in a smallest amount of jitter generated by the PLL module 130. Having completed the iterations, the output of the state controller 320 can correspond to the candidate configuration that resulted in the smallest lock code spread.

For example, the jitter measurement techniques described herein can be performed as part of a particular sequence, such as a power-up sequence for an integrated circuit, a diagnostic sequence for an integrated circuit, etc. In such contexts, embodiments of the jitter calibration system 150 can be used to configure the PLL parameters 115 of the PLL module 130 (e.g., to set a calibration code) for minimum jitter generation (e.g., for optimal jitter performance). To support such sequences, embodiments of the jitter calibration system 150 can include a trigger input and a trigger output. Receipt of an asserted trigger signal (at the trigger input) can trigger the jitter calibration system 150 to calibrate the PLL module 130 for improved jitter performance. Upon completion of the calibration (e.g., when the output of the state controller 320 has been set according to an optimized configuration for the PLL parameters 115), embodiments of the jitter calibration system 150 can output a signal via the trigger output to signal other components (e.g., a controller of the sequence) that the calibrations has completed.

Figure 4:
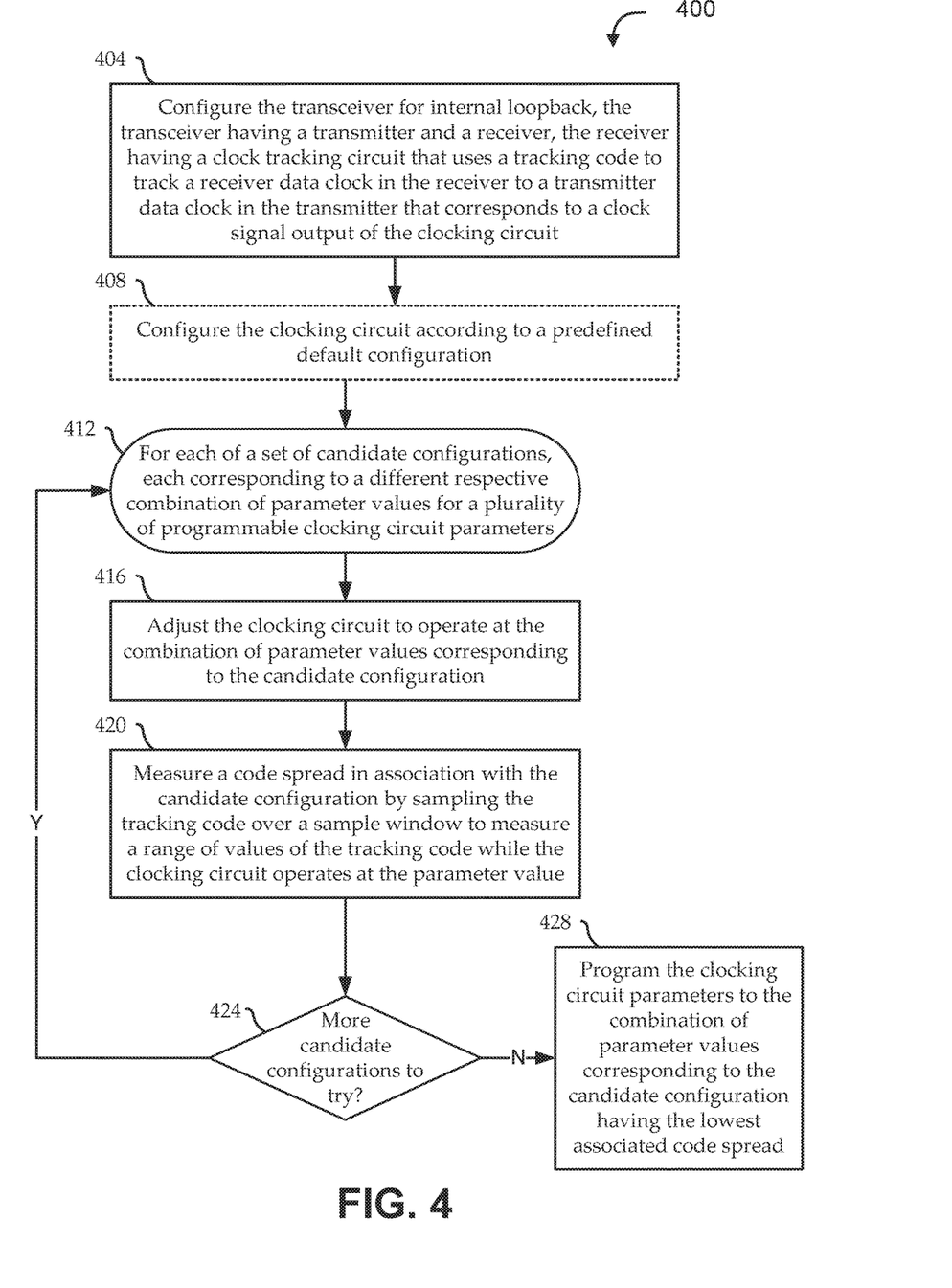
FIG. 4 shows an illustrative method for improving jitter performance of a clocking circuit coupled with a transceiver, according to various embodiments.

FIG. 4 shows an illustrative method 400 for improving jitter performance of a clocking circuit coupled with a transceiver, according to various embodiments. Embodiments are described in context of the systems of FIGS. 1-3 for added clarity (e.g., the method 400 can be used with the state machine implementation of the jitter calibration system 150 described in FIG. 3), though the method 400 can be implemented using any suitable system. Embodiments of the method 400 can begin at stage 404 by configuring the transceiver for internal loopback (e.g., by coupling a data output of the transmitter with a data input of the receiver). The transceiver is assumed to have a transmitter and a receiver, and the receiver is assumed to have a clock tracking circuit that uses a tracking code to track a receiver data clock in the receiver to a transmitter data clock in the transmitter that corresponds to a clock signal output of the clocking circuit. For example, the clocking circuit can be a PLL, the transceiver can be a SERDES that includes a CDR circuit in its receiver system, and the CDR circuit can have a locking code that indicates its clock phase tracking. In some embodiments, at stage 408, the clocking circuit can be configured to a predefined default configuration. For example, such configuring can include setting a supply voltage for the PLL to a predetermined regulated level (e.g., by setting fine and/or coarse current control levels, or in any other suitable manner), setting a charge pump current for the PLL to a predetermined nominal value (e.g., to a calibration level determined in a laboratory setting prior to operation), and/or setting any other parameters (e.g., the PLL parameters 115, such as those controlled by a calibration code 270, as described above).

For each of a number of candidate configurations (indicated by node 412), the method 400 can iteratively identify a configuration for the clocking circuit that generates a smallest amount of jitter. For example, each candidate configuration can correspond to a parameter value setting for each of one or more programmable clocking circuit parameters. In one implementation, the candidate configurations correspond to a range of values for one particular programmable clocking circuit parameters (e.g., with the other parameters held constant). In another implementation, each candidate configuration corresponds to a unique combination of settings for two or more programmable clocking circuit parameters. For example, each of the plurality of candidate configurations corresponds to a respective one of N×M combinations of M parameter values for each of N of programmable clocking circuit parameters.

In each iteration, at stage 416, the clocking circuit can be adjusted to operate at the parameter values corresponding to the candidate configuration. For example, a calibration code for a PLL can be set to a value that configures the PLL according to the candidate configuration for the iteration. In each iteration, at stage 420, a code spread can be measured in association with the parameter values for the candidate configuration by sampling the tracking code over a sample window to measure a range of values of the tracking code while the clocking circuit operates at the parameter values. For example, while the clocking circuit operates in each candidate configuration, it inherently generates a certain amount of jitter, which can cause the CDR locking code to move around as the CDR tracks the drifting phase of the data signal. The range of sampled values for the CDR locking code over the sampling window can be used to generate a measurement of the code spread (e.g., by taking the spread between the minimum and maximum values of the CDR locking code, by computing a spread based on a statistical distribution, etc.).

At stage 424, a determination is made as to whether more candidate configurations are left to try. If so, the method 400 iterates again to the next candidate configuration by returning to node 412. For example, suppose the candidate configurations are designed to try each of five settings for charge pump current (e.g., I_CP 225) in context of each of five settings for voltage controlled oscillator coarse current (e.g., I_Coarse 255), such that there are 25 candidate configurations. If the tracking code is being sampled at 100 MHz, and the sampling window is 300 samples, each iteration would take approximately 3 microseconds; and all the candidate configurations can be tried in approximately 75 microseconds.

Having tried all the candidate configurations (i.e., if the determination at stage 424 is that no candidate configurations are left to try), the method 400 has a measured code spread for each candidate configuration. Embodiments can continue at stage 428 by programming the clocking circuit parameter to the candidate configuration corresponding to the combination of parameters value having the lowest associated code spread. As described herein, the lowest code spread can correspond to the lowest amount of generated jitter, such that setting the clocking system to that configuration can effectively calibrate the clocking system for minimum jitter. This can also effectively calibrate the transceiver for optimal jitter performance, the transceiver will be contending with the lowest amount of jitter generated by the clocking system and should have increased tolerance for other jitter sources.

The methods disclosed herein comprise one or more actions for achieving the described method. The method and/or actions may be interchanged with one another without departing from the scope of the claims. In other words, unless a specific order of actions is specified, the order and/or use of specific actions may be modified without departing from the scope of the claims.

The steps of a method or algorithm or other functionality described in connection with the present disclosure, may be embodied directly in hardware, in a software module executed by a processor, or in a combination of the two. A software module may reside in any form of tangible storage medium. Some examples of storage media that may be used include random access memory (RAM), read only memory (ROM), flash memory, EPROM memory, EEPROM memory, registers, a hard disk, a removable disk, a CD-ROM and so forth. A storage medium may be coupled to a processor such that the processor can read information from, and write information to, the storage medium. In the alternative, the storage medium may be integral to the processor. A software module may be a single instruction, or many instructions, and may be distributed over several different code segments, among different programs, and across multiple storage media. Thus, a computer program product may perform operations presented herein. For example, such a computer program product may be a computer readable tangible medium having instructions tangibly stored (and/or encoded) thereon, the instructions being executable by one or more processors to perform the operations described herein. The computer program product may include packaging material. Software or instructions may also be transmitted over a transmission medium. For example, software may be transmitted from a website, server, or other remote source using a transmission medium such as a coaxial cable, fiber optic cable, twisted pair, digital subscriber line (DSL), or wireless technology such as infrared, radio, or microwave.

Other examples and implementations are within the scope and spirit of the disclosure and appended claims. For example, features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C). Further, the term "exemplary" does not mean that the described example is preferred or better than other examples.

Various changes, substitutions, and alterations to the techniques described herein can be made without departing from the technology of the teachings as defined by the appended claims. Moreover, the scope of the disclosure and claims is not limited to the particular aspects of the process, machine, manufacture, composition of matter, means, methods, and actions described above. Processes, machines, manufacture, compositions of matter, means, methods, or actions, presently existing or later to be developed, that perform substantially the same function or achieve substantially the same result as the corresponding aspects described herein may be utilized. Accordingly, the appended claims include within their scope such processes, machines, manufacture, compositions of matter, means, methods, or actions.

What is claimed is:

1. A method for calibrating clocking circuit-generated jitter, the method comprising:
  configuring a transceiver coupled with the clocking circuit for internal loopback, the transceiver having a transmitter and a receiver, the receiver having a clock tracking circuit that uses a tracking code to track a receiver data clock in the receiver to a transmitter data clock in the transmitter that corresponds to a clock signal output of the clocking circuit;
  for each of a set of parameter values of a programmable clocking circuit parameter:
    adjusting the clocking circuit to operate at the parameter value; and
    measuring a code spread in association with the parameter value by sampling the tracking code over a sample window to measure a range of values of the tracking code while the clocking circuit operates at the parameter value; and
  programming the clocking circuit parameter to the parameter value having the lowest associated code spread.

2. The method of claim 1, further comprising:
identifying a plurality of candidate configurations, each corresponding to a different respective combination of parameter values for a plurality of programmable clocking circuit parameters; and
performing the adjusting and the measuring for each of the plurality of candidate configurations,
wherein the programmable clocking circuit parameter is one of a plurality of programmable clocking circuit parameters, each having a respective set of parameter values, and
wherein the programming comprises programming the clocking circuit parameter to the candidate configuration corresponding to the combination of parameters value having the lowest associated code spread.

3. The method of claim 2, wherein:
each of the plurality of candidate configurations corresponds to a respective one of N×M combinations of M parameter values for each of N of programmable clocking circuit parameters.

4. The method of claim 2, wherein:
a first of the programmable clocking circuit parameters controls a charge pump; and
a second of the programmable clocking circuit parameters controls a voltage controlled oscillator.

5. The method of claim 1, wherein configuring the transceiver for internal loopback comprises coupling a data output of the transmitter with a data input of the receiver.

6. The method of claim 1, wherein the clocking circuit is a phase-locked loop (PLL) circuit.

7. The method of claim 6, further comprising:
setting a supply voltage for the PLL to a predetermined regulated level; and
setting a charge pump current for the PLL to a predetermined nominal value.

8. The method of claim 1, wherein the clock tracking circuit is a clock data recovery (CDR) circuit, and the tracking code is a CDR locking code.

9. A transceiver calibration system comprising:
a clocking circuit that generates a clock signal output according to a plurality of hardware-controllable clocking circuit parameters;
a transceiver having:
a transmitter coupled with the clocking circuit; and
a receiver coupled, in an internal loopback configuration, with the transmitter, the receiver comprising a clock tracking circuit that uses a tracking code to track a receiver data clock to a transmitter data clock that corresponds to the clock signal output; and
a hardware-implemented jitter calibration system having instructions stored thereon, which, when executed, cause the jitter calibration system to perform steps comprising:
for each of a plurality of candidate configurations, each corresponding to a different respective combination of parameter values for the plurality of hardware-programmable clocking circuit parameters:
adjusting the clocking circuit to operate at the combination of parameter values; and
measuring a code spread in association with the combination of parameter values by sampling the tracking code over a sample window to measure a range of values of the tracking code while the clocking circuit operates at the combination of parameter values; and
programming the clocking circuit parameter to the candidate configuration corresponding to the combination of parameters value having the lowest associated code spread.

10. The system of claim 9, further comprising:
a serializer/deserializer (SERDES) circuit comprising the clocking circuit, the transceiver, and the jitter calibration system.

11. A transceiver calibration system comprising:
a clocking circuit that generates a clock signal output according to a plurality of hardware-controllable clocking circuit parameters;
a transceiver having:
a transmitter coupled with the clocking circuit; and
a receiver coupled with the transmitter comprising a clock tracking circuit; and
a hardware-implemented jitter calibration system having instructions stored thereon, which, when executed, cause the jitter calibration system to perform steps comprising:
for each of a plurality of candidate configurations:
adjusting the clocking circuit to operate at a combination of parameter values; and
measuring a code spread in association with the combination of parameter values; and
programming the clocking circuit parameter to the candidate configuration corresponding to the combination of parameters value.

12. The system of claim 11, further comprising a serializer/deserializer (SERDES) circuit comprising the clocking circuit, the transceiver, and the jitter calibration system.

13. The system of claim 11, wherein the clock tracking circuit includes a tracking code to track a receiver data clock to a transmitter data clock that corresponds to the clock signal output.

14. The system of claim 11, wherein the candidate configurations each correspond to a different respective combination of the parameter values for the plurality of hardware-programmable clocking circuit parameters.

15. The system of claim 11, wherein the measuring of the code spread is performed by sampling the tracking code over a sample window to measure a range of values of the tracking code.

16. The system of claim 15, wherein the sampling of the tracking code is performed while the clocking circuit operates at the combination of parameter values.

17. The system of claim 11, wherein the combination of parameter values used in the programming has the lowest associated code spread.

* * * * *